US006207510B1

(12) United States Patent
Abeln et al.

(10) Patent No.: US 6,207,510 B1
(45) Date of Patent: Mar. 27, 2001

(54) METHOD FOR MAKING AN INTEGRATED CIRCUIT INCLUDING HIGH AND LOW VOLTAGE TRANSISTORS

(75) Inventors: Glenn C. Abeln; Robert Alan Ashton; Samir Chaudhry; Alan R. Massengale; Jinghui Ning, all of Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/363,769

(22) Filed: Jul. 29, 1999

Related U.S. Application Data
(60) Provisional application No. 60/115,718, filed on Jan. 12, 1999.

(51) Int. Cl.[7] ............................................. H01L 21/8236
(52) U.S. Cl. ........................... 438/276; 438/283; 438/297
(58) Field of Search ................................. 438/217, 223, 438/227, 275, 276, 283, 298, 290, 291, 297

(56) References Cited

U.S. PATENT DOCUMENTS

| | | | |
|---|---|---|---|
| 5,403,764 | * 4/1995 | Yamamoto et al. | 438/276 |
| 5,903,493 | 5/1999 | Lee | 365/149 |
| 6,030,862 | * 2/2000 | Kepler | 438/217 |
| 6,043,128 | * 3/2000 | Kamiya | 438/289 |

\* cited by examiner

*Primary Examiner*—David Nelms
*Assistant Examiner*—Dung Anh Le
(74) *Attorney, Agent, or Firm*—Allen, Dyer, Doppelt, Milbrath & Gilchrist, P.A.

(57) ABSTRACT

A method for making an integrated circuit includes the steps of forming a plurality of spaced apart isolation regions in a substrate to define active regions therebetween, forming a first mask, and using the first mask for performing at least one implant in the active regions for defining high voltage active regions for the high voltage transistors. The method further includes the steps of removing the first mask and forming a second mask, and using the second mask for performing only one implant for converting at least one high voltage active region into a low voltage active region for a low voltage transistor. All of the implants needed to define the high voltage transistors are first performed throughout the active regions using the first mask. A separate single implant is then performed using the second mask to convert at least one of the high voltage active regions to a low voltage active region. A gate dielectric layer is formed on the high and low voltage active regions for corresponding high and low voltage transistors, and gates are formed on the gate dielectric layers.

31 Claims, 6 Drawing Sheets

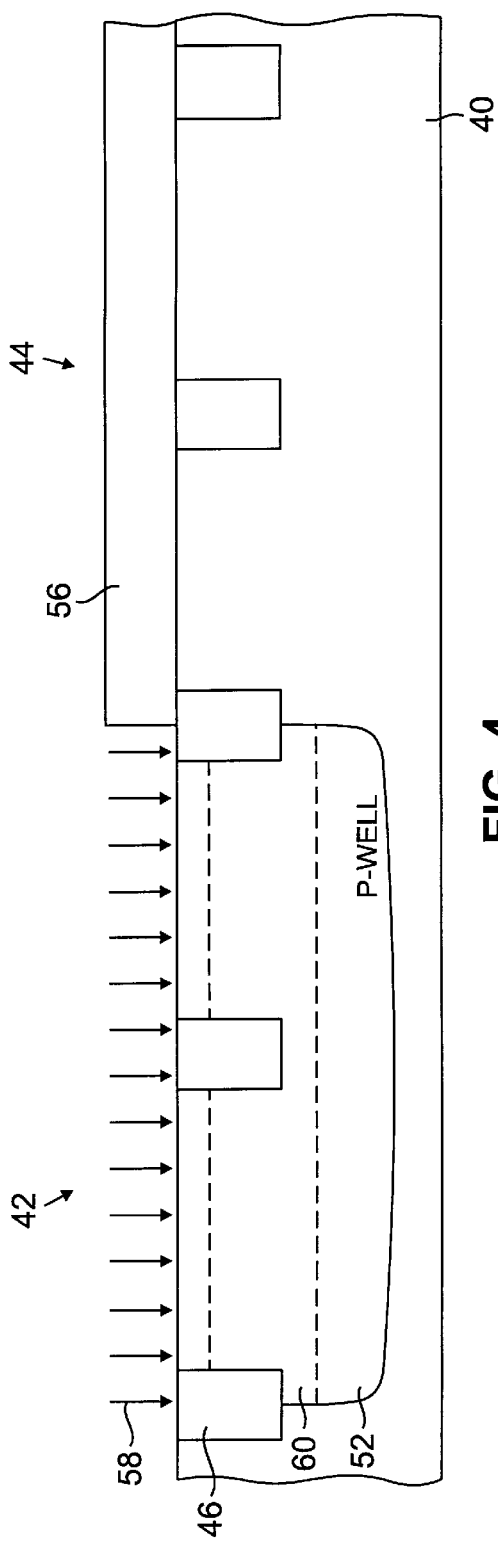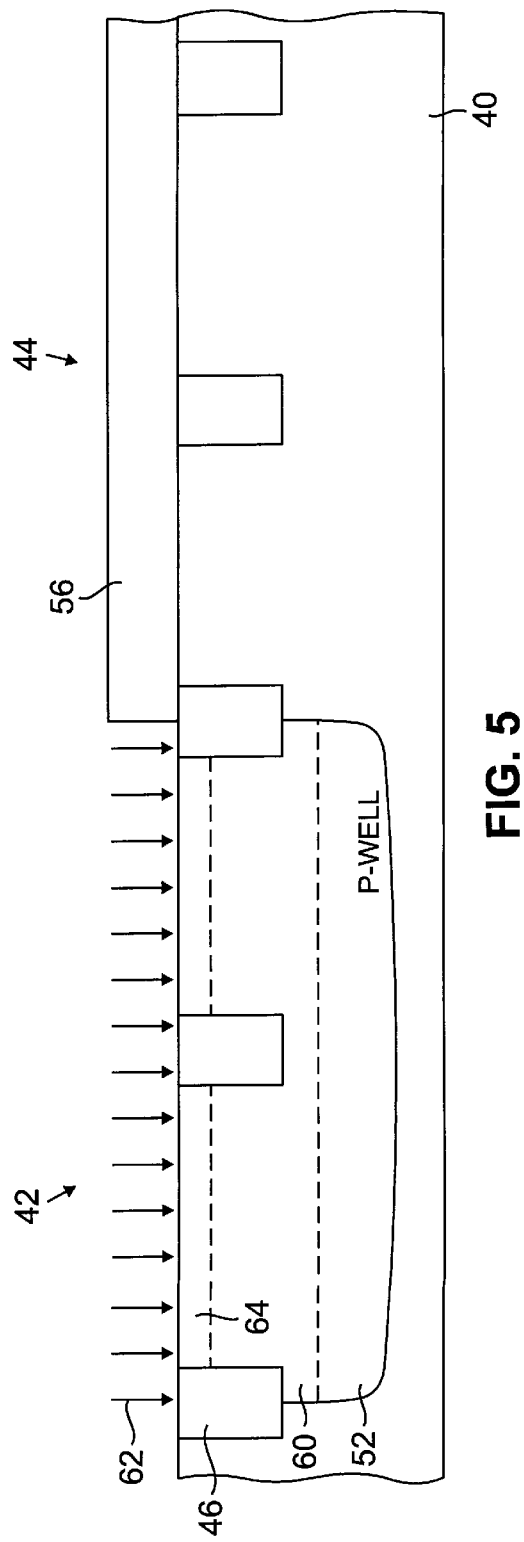

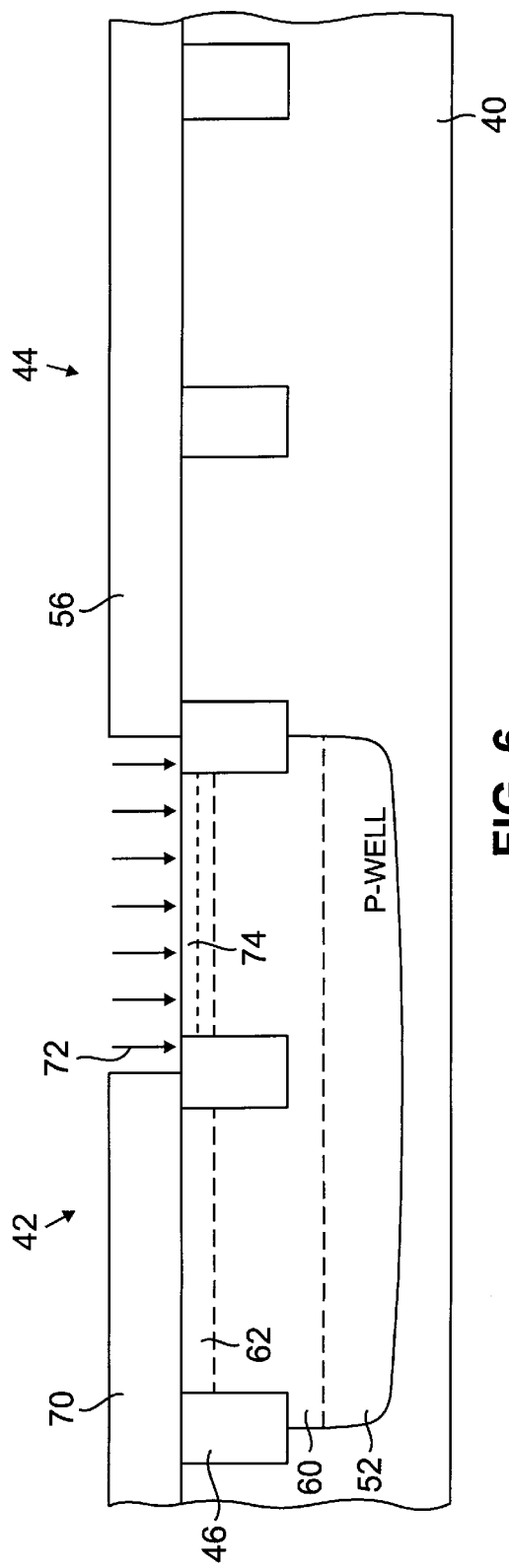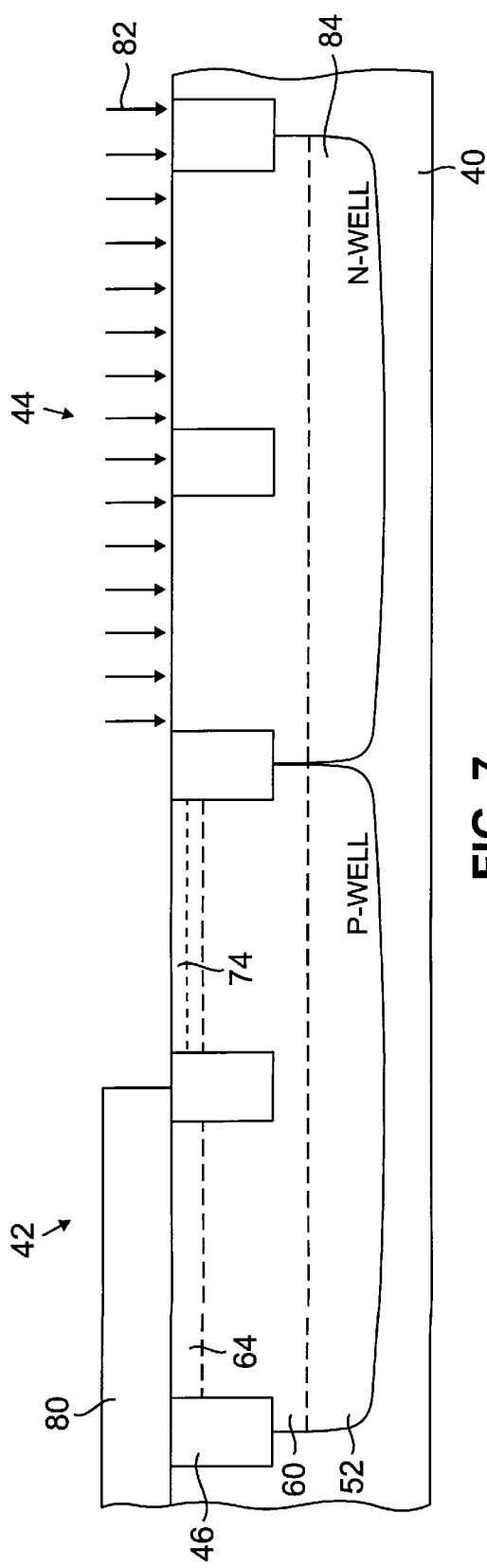

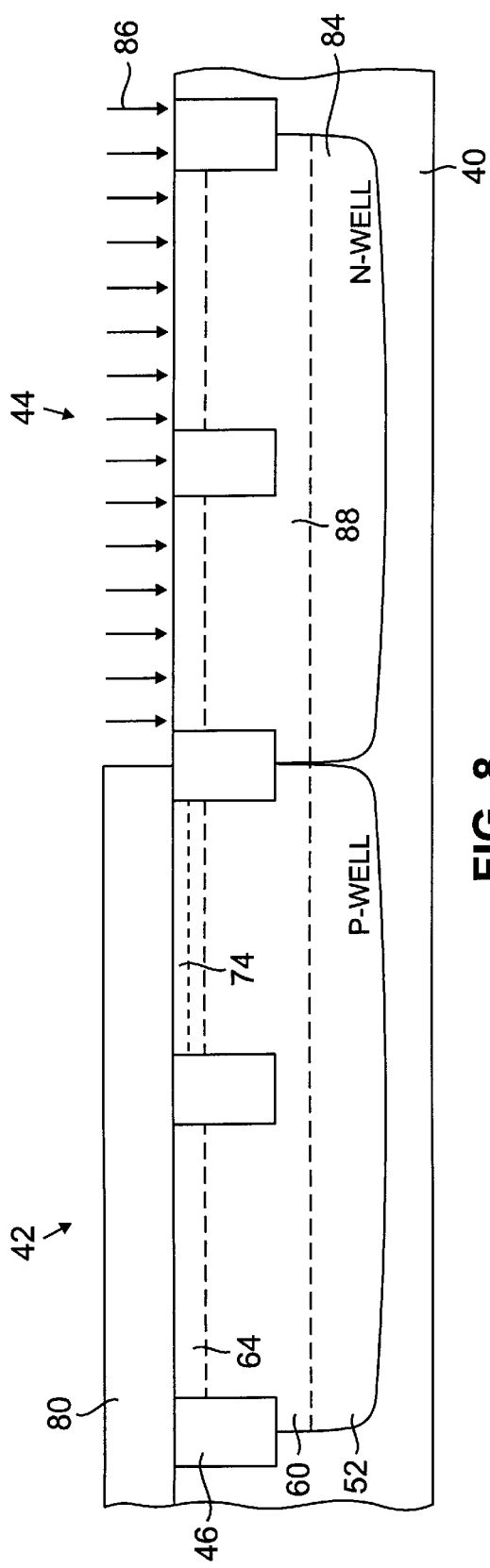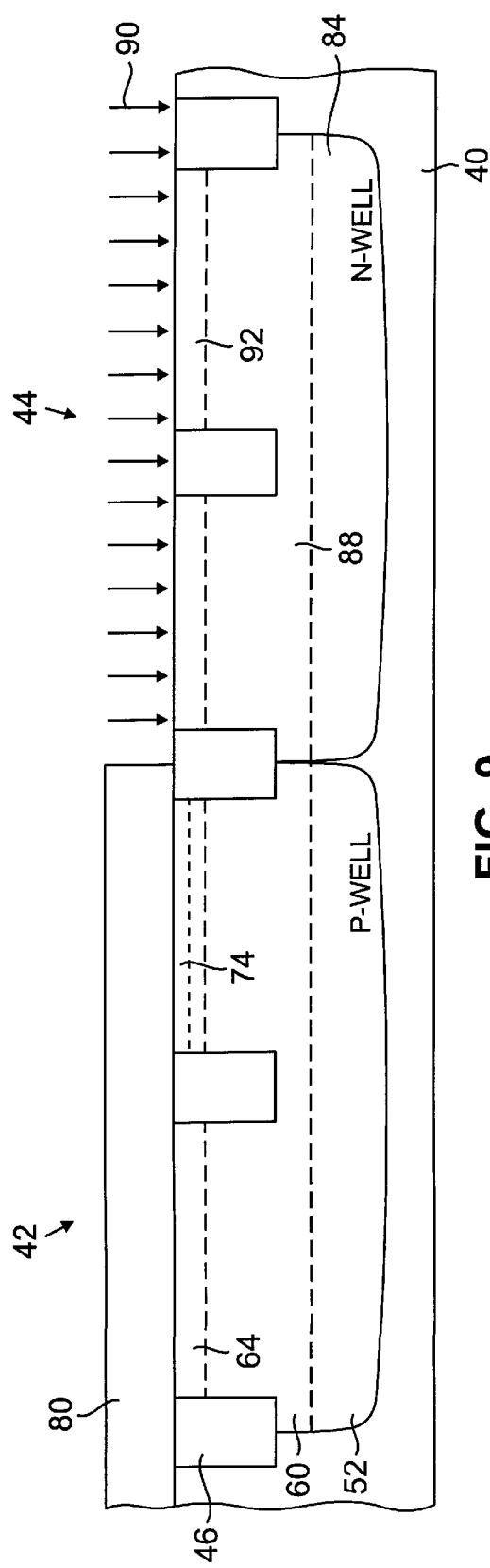

METHOD FOR MAKING AN INTEGRATED CIRCUIT INCLUDING HIGH AND LOW VOLTAGE TRANSISTORS

RELATED APPLICATION

This application is based upon prior filed copending provisional application Ser. No. 60/115,718 filed Jan. 12, 1999, the entire disclosure of which is incorporated herein by reference.

FIELD OF THE INVENTION

The present invention relates to the field of semiconductor devices, and, more particularly, to a method for making an integrated circuit.

BACKGROUND OF THE INVENTION

As Complementary Metal Oxide Semiconductor (CMOS) technologies advance with smaller feature sizes and thinner gate oxides, power supply voltages have been scaled down to improve reliability and to conserve power. For MOS field effect transistors (MOSFETs), a thinner gate oxide corresponds to a faster device and to a lower voltage threshold. Even with operating voltages being reduced, some low voltage MOSFETs, which typically operate at 1.5 to 2.5 volts, must still interface with high voltage MOSFETs, which typically operate at 3.3 to 5 volts. There is also a need for high voltage MOSFETs to preform certain analog functions not easily performed at low voltage. Because MOSFETs can be designed to operate at different operating voltages for performing different functions, it is desirable for a semiconductor substrate to include different thicknesses of gate oxide layers to accommodate the different operating voltages.

Such a dual voltage semiconductor device is formed by growing two different gate oxide thicknesses. Thin gate oxides are grown for low voltage transistors, and thick gate oxides are grown for high voltage transistors. Furthermore, different gate oxide thicknesses require different doping levels under the gate oxide at the surface of the semiconductor substrate to obtain the correct transistor properties for the desired voltage threshold.

The extra processing steps needed to create a dual voltage semiconductor device may be performed by separately implanting high and low voltage active regions corresponding to the high and low voltage transistors to be formed therein. One approach is to mask off a portion of the semiconductor substrate to define the high voltage active regions. The high voltage active regions are defined by implanting impurities into the semiconductor substrate. This procedure typically requires three implantation steps. One for the well implant, one to suppress punch-through formation of the transistor, and a third to adjust a voltage threshold of the transistor. Once the high voltage active regions are defined, then the regions are masked off so that the additional implantation steps can be performed to define the low voltage active regions. Therefore, separately implanting high and low voltage active regions requires extra masking steps and repeated implantation steps to independently control definition of the high and low voltage transistors to be formed.

Instead of performing separate implantation steps for the high and low voltage active regions, another approach is to use a single mask to perform implantations that are common to both the high and low voltage active regions. This step avoids having to perform repeat implant steps. Common implantations include defining the wells and inhibiting or suppressing punch-through formation of the transistors. However, extra masks are required for performing the individual voltage threshold adjust implants for defining the particular thresholds of the high and low voltage transistors The choice between using extra masks or performing repeated implantation steps for forming a desired dual voltage integrated circuit depends on the relative cost of photolithography processing versus the cost of performing implantation steps. Consequently, there is a continuing need to reduce processing costs in forming dual voltage integrated circuits, particularly through the reduction of masks and repeated implantation steps.

SUMMARY OF THE INVENTION

In view of the foregoing background, it is therefore an object of the present invention to provide a method for making an integrated circuit including high and low voltage transistors at a reduced processing cost.

It is another object of the present invention to provide a method for making an integrated circuit including high and low voltage transistors using a reduced number of masks and without performing repeated implantation steps These and other advantages, features and objects in accordance with the present invention are provided by a method for making an integrated circuit including high and low voltage transistors comprising the steps of forming a plurality of spaced apart isolation regions in a substrate to define active regions therebetween, forming a first mask, and using the first mask for performing at least one implant in the active regions for defining high voltage active regions for the high voltage transistors. The method preferably further includes the steps of removing the first mask and forming a second mask, and using the second mask for performing only one implant for converting at least one high voltage active region into a low voltage active region for a low voltage transistor.

All of the implantations needed to define the high voltage transistors are thus performed throughout the active regions using the first mask. Consequently, this defines all of the active regions to be high voltage active regions. A separate adjustment implantation is then performed using the second mask to convert at least one of the high voltage active regions to a low voltage active region for the low voltage transistor. Because this adjustment implantation can be performed to convert at least one high voltage active region to a low voltage active region, only one additional mask is needed, and no repeated implantations are required. This advantageously reduces processing costs for making an integrated circuit including high and low voltage transistors.

The method also preferably includes the steps of forming gate dielectric layers on the high and low voltage active regions for corresponding high and low voltage transistors, and forming gates on the gate dielectric layers.

BRIEF DESCRIPTION OF THE DRAWINGS

FIGS. 2–10 are cross-sectional views of a portion of an integrated circuit illustrating the process steps in accordance with the preset invention.

DETAILED DESCRIPTION OF THE PREFERRED EMBODIMENTS

Figure 1:
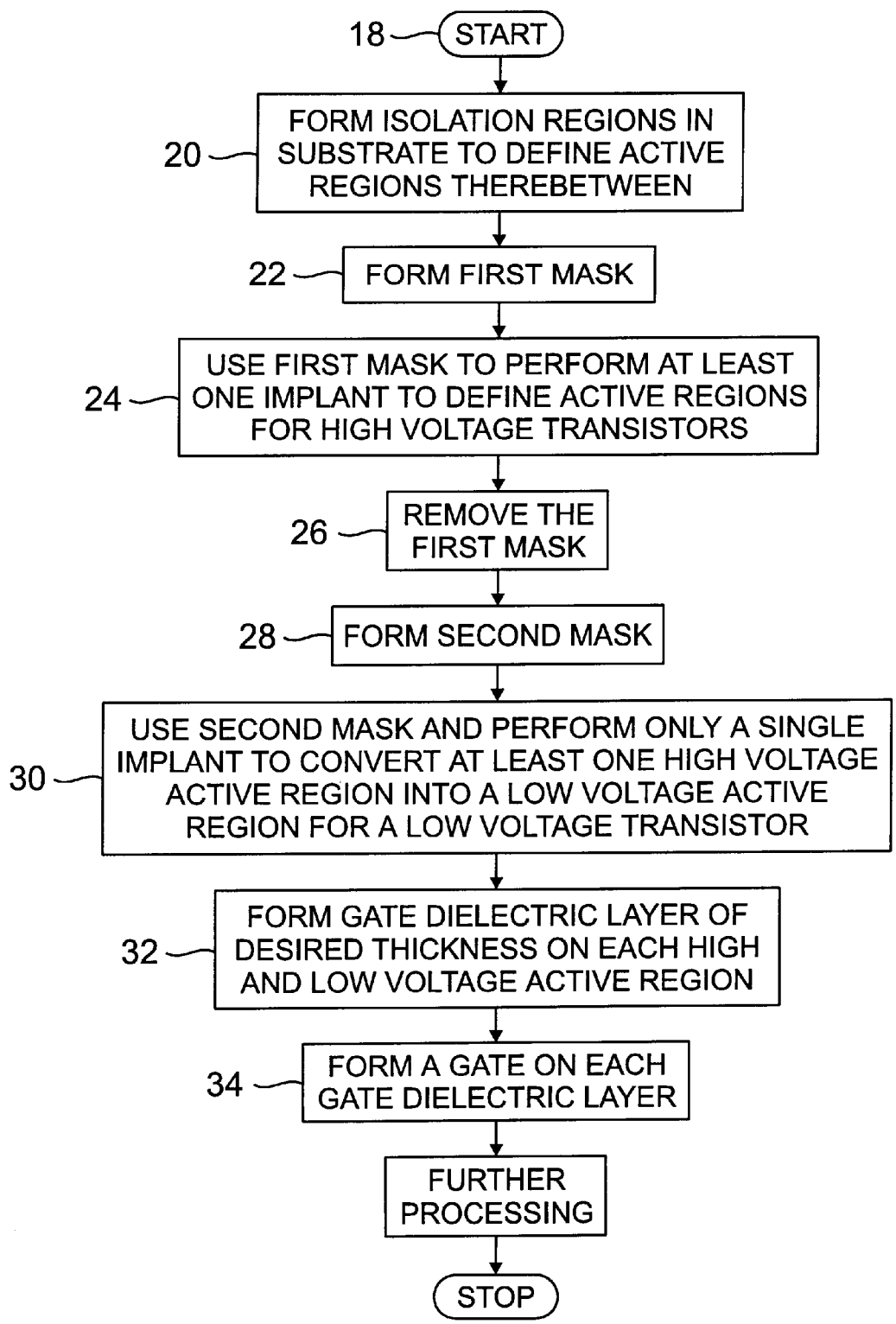
FIG. 1 is a flow chart illustrating the method for making an integrated circuit including high and low voltage transistors in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity Referring now to FIG. 1, a method for making an integrated circuit including high and low voltage transistors in accordance with the present invention is first described. From the start (Block 18), a plurality of spaced apart isolation regions in a substrate are formed so that active regions may be defined therebetween (Block 20). Next, a first mask is formed (Block 22) for performing at least one implant in the active regions for defining high voltage active regions for the high voltage transistors (Block 24). The at least one implant for defining active regions typically associated with CMOS processing includes three implantation steps. One implant is a well implant, a second implant is a device punch-through implant, and a voltage threshold adjust is a third implant, as will be described in greater detail below. However, a greater or fewer number of implantations may be needed depending on specific applications, as readily appreciated by one skilled in the art.

The method further includes the steps of removing the first mask (Block 26) and forming a second mask (Block 28). The second mask is then used for performing only one implant for converting at least one high voltage active region into a low voltage active region for a low voltage transistor (Block 30). This single implant step adjusts the doping profile of the surface of the semiconductor substrate for converting the voltage threshold of the high voltage active region to correspond to a voltage threshold for a low voltage active region. This single implant step for adjusting the voltage threshold for defining a low voltage transistor will be also be described in greater below. The method further includes the step of forming gate dielectric layers on the high and low voltage active regions for the corresponding high and low voltage transistors (Block 32), and the step of forming gates on the gate dielectric layers (Block 34).

Figure 2:
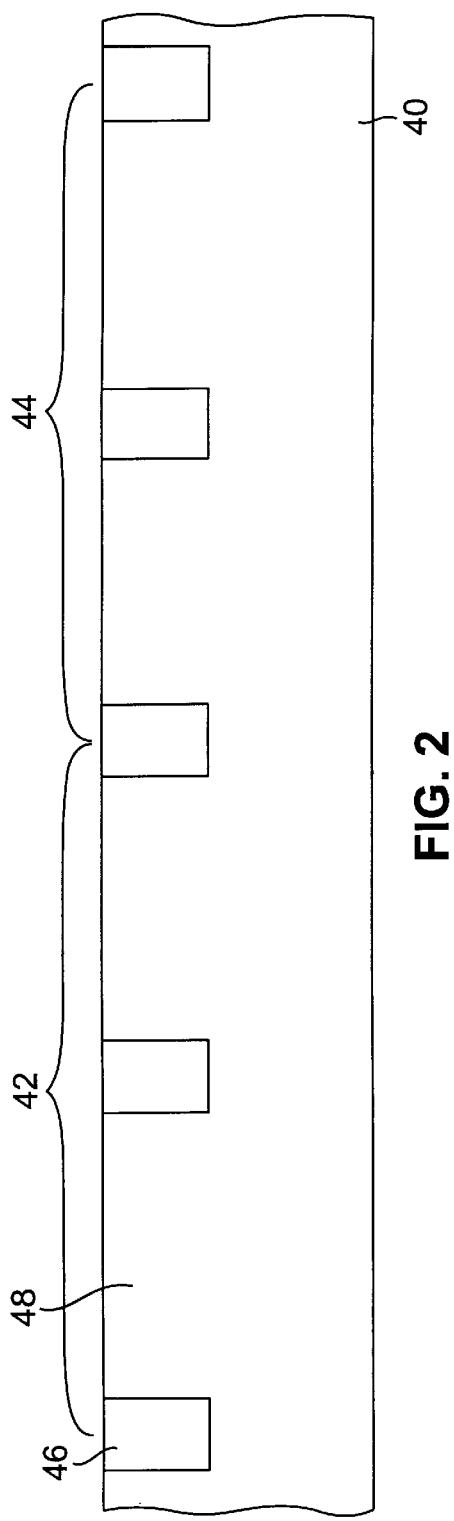

The method according to the present invention for making an integrated circuit including high and low voltage transistors advantageously performs all of the implantations needed to define the high voltage transistors throughout the active regions using the first mask. This step avoids having to use a separate mask for individually defining the high voltage active regions, and a separate mask for individually defining the low voltage active regions. In other words, this step avoids having to perform repeated implantations to form the deeper doping levels which are common between the high and low voltage transistors. A repeated implantation is one where a common implant necessary for both the high and low voltage active regions is separately implanted using separate masks, as would be the case for individually defining the having and low voltage active regions. Because an adjustment implantation can be performed to convert at least one high voltage active region to a low voltage active region, only one additional mask is needed, and no repeated implantations are required. An advantage of defining the high voltage regions first, and then performing an adjustment implantation to define the low voltage regions, is because the low voltage transistors require a higher doping level. This higher doping level is due to the thin gate oxide required by the low voltage transistors The process steps for making a CMOS integrated circuit including high and low voltage transistors in accordance with the preset invention will now be described with reference to FIGS. 2–10. A semiconductor substrate 40 includes at least one n-channel region 42 and at least one p-channel region 44, as shown in FIG. 2. The n-channel region 42 is for the formation of n-channel transistors, whereas the p-channel region 44 is for the formation of p-channel transistors. The semiconductor substrate 40 is preferably a silicon substrate comprising single crystal silicon.

A plurality of spaced apart isolation structures or regions 46 are formed in the substrate 40 to define active regions 48 therebetween. The isolation regions 46 provide a physical and electrical separation between adjacent transistors to be formed in the corresponding active regions 48. The isolation regions 46 thus prevent undesirable coupling of adjacent transistors.

In one embodiment, the isolation regions 46 are shallow trench isolation structures formed by selectively etching the semiconductor substrate 40 to produce a plurality of shallow trenches. The trenches may be formed by anisotropically etching the semiconductor substrate 40 after forming a patterned mask (not shown) with a photolithography process. A trench dielectric is used to fill the shallow trenches. Afterwards, a planarization process, such as a chemical-mechanical polish, is used to remove the dielectric from regions external to the shallow trenches to produce a substantially planar upper surface.

Although the isolation regions 46 shown in FIG. 2 are of the shallow trench dielectric variety, alternative methods of isolating the transistors to be formed in the active regions 48 may be used. For example, the isolation regions 46 may comprise semi-recessed local oxidation structures (LOCOS), as will be readily understood by one skilled in the art.

Figure 3:
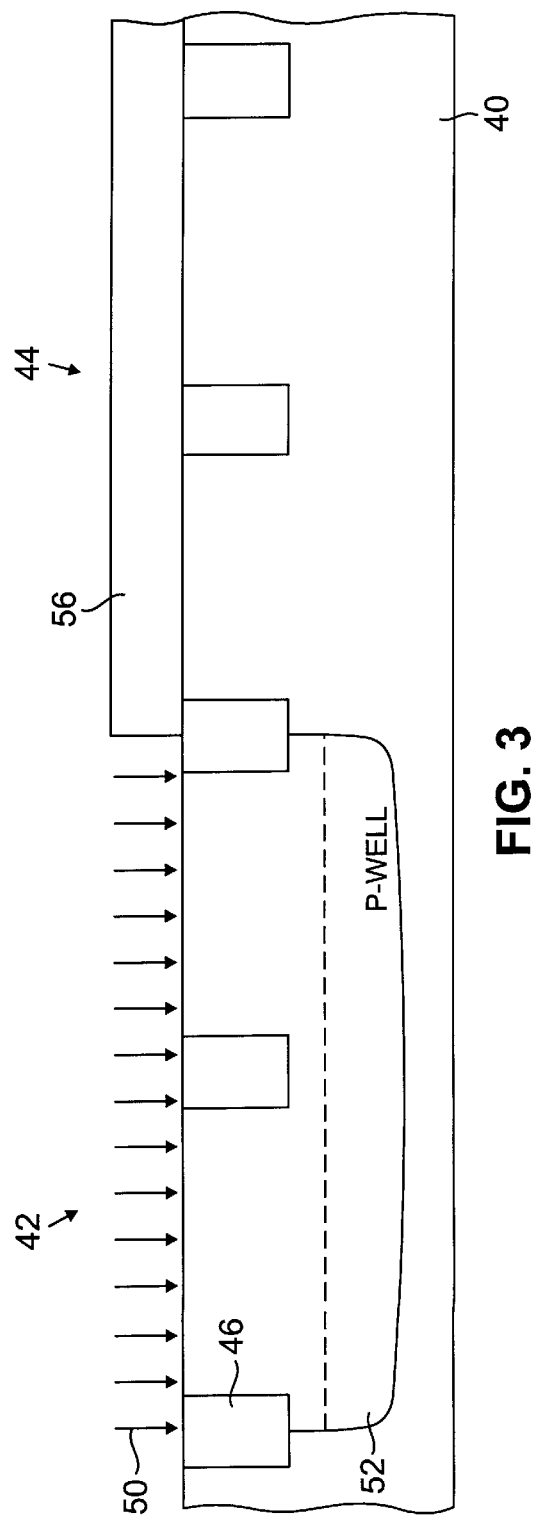

Referring now to FIG. 3, a first p-type implant 50 is performed to introduce a first impurity distribution 52 into the active regions 48 within the n-channel region 42. A first mask 56 is used to prevent energetic ions from being introduced into the p-channel region 44 during the first p-type implant 50. Although the n-channel region 42 is doped prior to the doping of the p-channel region 44, it is equally feasible to reverse this order such that the implantation of the p-channel region 44 precedes the implantation of the n-channel region 42, as readily understood by one skilled in the art. In addition, the actual number of implantations described herein may vary depending on specific applications.

The first implant 50 is carried out at a energy sufficient to insure that a peak concentration value of impurity distribution 52 is located at a sufficient depth below an upper surface of the semiconductor substrate 40. The depth is chosen so that the first impurity distribution 52 is deep enough to provide an effective isolation or channel stop between adjacent transistors. In one embodiment, the first implant 50 comprises boron ions having a peak concentration of approximately 5E16 ions/cm$^3$ located at a depth below the upper surface of the semiconductor substrate 40 of approximately 0.43 microns. Such a distribution may be formed by implanting boron ions at an energy of approximately 150 keV using a dose of approximately 3.5E12/cm$^2$. More generally, the first implant 50 is preferably carried out at an energy within a range of about 140 to 300 keV using a dose of 2E12/cm² to 8E12/cm².

A second implant 58 is performed to introduce a second impurity distribution 60 into the n-channel region 42 of the semiconductor substrate 40, as shown in FIG. 4. The second implant 58 uses the same first mask 56 to prevent energetic ions from being introduced into the p-channel region 44 during the second p-type implant 58. The second impurity distribution 60 provides an effective inhibiting of device punch-through, as readily understood by one skilled in the art. Due to the lower energy of the second implant 58, the second impurity distribution 60 is shallower than the depth of first impurity distribution 52.

More specifically, device punch-through occurs when a voltage applied to a source/drain region of a transistor forms a depletion region around the peripheral of the source/drain region. In short channel devices, the depletion region formed around a biased source/drain region can extend across the channel of a transistor thereby eliminating the inversion region associated with the normal operation of MOS transistors and resulting in a space charge limited current inversely proportional to the cube of the channel length. The strong dependence of the device punch-through current upon the channel length makes it important to limit the extent to which the depletion region around the drain extends into the channel. The second impurity implant 58 thus increases the impurity distribution proximal to the drain, thereby limiting the dimensions of the depletion region.

In one embodiment, the second impurity distribution 60 comprises boron ions having a peak concentration value of approximately 1E13 ions/cm³ located at a depth below the upper surface of the semiconductor substrate 40 of approximately 0.20 microns. Such a distribution may be formed by implanting boron ions at an energy of approximately 60 keV using a dose of approximately 3E12/cm². More generally, the second implant 58 is carried out at an energy within a range of about 50–100 keV using a dose of 2E12/cm² to 8E12/cm².

Referring now to FIG. 5, a third implant 62 is performed to introduce a third impurity distribution 64 into the n-channel region 42 of the semiconductor substrate 40. The third implant 62 also uses the first mask 56 to prevent energetic ions from being introduced into the p-channel region 44 during the third p-type implant 62 The third implant 62 is performed to introduce a voltage threshold adjust impurity distribution into a region proximal to the upper surface of the semiconductor substrate 40 within the active regions of the n-channel region 42. Through the use of this third implant 62, both the active regions in the n-channel region 42 are adjusted so that the voltage threshold corresponds to the high voltage transistors to be formed therein.

In one embodiment, the third impurity distribution 62 comprises boron ions having a peak concentration value of approximately 1E12 ions/cm³ located at a depth below the upper surface of the semiconductor substrate 40 of approximately 0.10 microns. Such a distribution may be formed by implanting boron ions at an energy of approximately 30 keV using a dose of approximately 1.5E12/cm². More generally, the third implant 58 is carried out at an energy within a range of about 25–50 keV using a dose of 0.5E12/cm² to 4E12/cm².

Referring now to FIG. 6, a second mask 70 is used for performing a fourth implant 72 for converting at least one of the high voltage active regions for a high voltage transistor to a low voltage active region for a low voltage transistor. This single implant 72 introduces a fourth impurity distribution 74 into the n-channel region 42 of the semiconductor substrate 40. The high voltage active region is converted to a low voltage active region by implanting a same species dopant, such as boron or indium.

The additional implantation of the boron into a high voltage active region converts the region to a low voltage active region. An advantage of defining the high voltage regions first, and then performing this adjustment implantation to define the low voltage regions, is because the low voltage transistors require a higher doping level. This higher doping level is due to the thin gate oxide required by the low voltage transistors.

In one embodiment, the fourth impurity distribution 74 comprises boron ions having a peak concentration value of approximately 0.5E12 ions/cm³ located at a depth below the upper surface of the semiconductor substrate 40 of approximately 0.05 microns. Such a distribution may be formed by implanting boron ions at an energy of approximately 15 keV using a dose of approximately 0.5E12/cm². More generally, the fourth implant 72 is carried out at an energy within a range of about 5–25 keV using a dose of 0.5E11/cm² to 1E12/cm².

The method for defining high and low voltage active regions as described above advantageously performs all of the implants using the first mask 56 so that all the active regions are defined as high voltage active regions. Because an adjustment implant 72 can be performed using the second mask 70 to convert a high voltage active region to a low voltage active region, only one additional mask is needed without having to perform repeated implantation steps Turning now to FIGS. 7–10, steps similar to those illustrated in FIGS. 3–6 are used to implant impurities within the p-channel region 44 of the semiconductor substrate 40 for the transistors to be formed in the active regions 48 between the illustrated isolation regions 46. As shown in FIG. 7, a third photoresist mask 80 is used to selectively expose p-channel region 44 of the semiconductor substrate 40. A first n-type implant 82 is performed to introduce a first impurity distribution 84 into the active regions within the p-channel region 44. The third mask 80 is used to prevent energetic ions from being introduced into the n-channel region 42 during the first n-type implant 82.

The first implant 82 is carried out at a energy sufficient to insure that a peak concentration value of impurity distribution 84 is located at sufficient depth below an upper surface of the semiconductor substrate 40. The depth is chosen so that the first impurity distribution 84 is deep enough to provide an effective isolation or channel stop between adjacent transistors. In one embodiment, the first implant 82 comprises phosphorous ions having a peak concentration of approximately 5E16 ions/cm³ located at a depth below the upper surface of the semiconductor substrate 40 of approximately 0.43 microns. Such a distribution may be formed by implanting phosphorous ions at an energy of approximately 380 keV using a dose of approximately 5E12/cm². More generally the first implant 82 is preferably carried out at an energy within a range of about 360 to 500 keV using a dose of 2E12/cm² to 8E12/cm².

A second implant 86 is performed to introduce a second impurity distribution 88 into the p-channel region 44 of the semiconductor substrate 40, as shown in FIG. 8. The second implant 86 uses the same third mask 80 to prevent energetic ions from being introduced into the n-channel region 42 during the second n-type implant 86. The second impurity distribution 88 provides an effective inhibiting of punch-through formation, as explained above. Due to the lower energy of the second implant 86, the second impurity distribution 88 is shallower than the depth of first impurity distribution 84.

In one embodiment, the second impurity distribution 86 comprises phosphorous ions having a peak concentration value of approximately 15E17 ions/cm$^3$ located at a depth below the upper surface of the semiconductor substrate 40 of approximately 0.20 microns. Such a distribution may be formed by implanting phosphorous ions at an energy of approximately 200 keV using a dose of approximately 2.5E12/cm$^2$. More generally, the second implant 86 is carried out at an energy within a range of about 150–280 keV using a dose of 2E12/cm$^2$ to 8E12/cm$^2$.

Referring now to FIG. 9, a third implant 90 is performed to introduce a third impurity distribution 92 into the p-channel region 44 of the semiconductor substrate 40. The third implant 90 also uses the third mask 80 to prevent energetic ions from being introduced into the n-channel region 42 during the third n-type implant 90. The third implant 90 is performed to introduce a voltage threshold adjust impurity distribution into a region proximal to the upper surface of the semiconductor substrate 40 within the active regions of the p-channel region 44. Through the use of this third implant 90, both the active regions in the p-channel region 44 are adjusted so that the voltage threshold corresponds to the high voltage transistors.

In one embodiment, the third impurity distribution 92 comprises phosphorous ions having a peak concentration value of approximately 0.5E17 ions/cm$^3$ located at a depth below the upper surface of the semiconductor substrate 40 of approximately 0.10 microns. Such a distribution may be formed by implanting phosphorous ions at an energy of approximately 125 keV using a dose of approximately 1.5E12/cm$^2$. More generally, the third implant 90 is carried out at an energy within a range of about 50–175 keV using a dose of 1E12/cm$^2$ to 4E12/cm$^2$.

Figure 10:
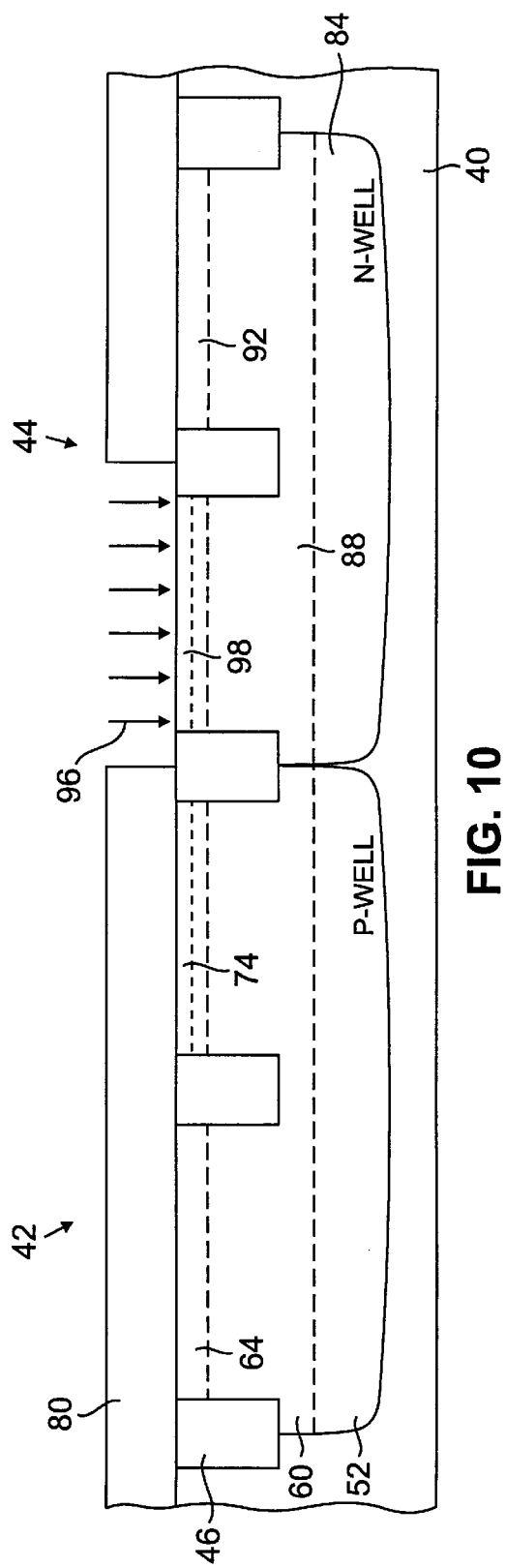

Referring now to FIG. 10, a fourth mask 94 is used for performing a fourth implant 96 for converting at least one of the high voltage active regions for a high voltage transistor to a low voltage active region for a low voltage transistor. This single implant 96 introduces a fourth impurity distribution 98 into the p-channel region 44 of the semiconductor substrate 40. The high voltage active region is converted to a low voltage active region by implanting a same species dopant, such as phosphorous, arsenic or antimony. The additional implantation of these dopants into a high voltage active region converts the region to a low voltage active region In one embodiment, the fourth impurity distribution 98 comprises phosphorus ions having a peak concentration value of approximately 0.5E18 ions/cm$^3$ located at a depth below the upper surface of the semiconductor substrate 40 of approximately 0.05 microns. Such a distribution may be formed by implanting phosphorus ions at an energy of approximately 25 keV using a dose of approximately 0.5E12/cm$^2$. More generally, the fourth implant 96 is carried out at an energy within a range of about 5–75 keV using a dose of 0.5E11/cm$^2$ to 1E12/cm$^2$.

After the completion of the implantation steps used to dope the n-channel region 42 and the p-channel region 44 of the semiconductor substrate 40, a high temperature process is desirable to activate the implanted ions and to repair damage done to the silicon lattice caused by the bombardment of the high energy ions used in the implantation process. While high temperature is desirable to achieve these benefits, high temperatures can also result in the undesirable redistribution of first, second third and fourth impurity distributions. To achieve the desired benefits of high temperature processing while avoiding the redistribution of the implants, a rapid thermal anneal process may be used. Therefore, a rapid thermal anneal step, preferably performed at a temperature of approximately 1,000–1,075 degrees C, may be performed after the implant steps.

Figure 11:
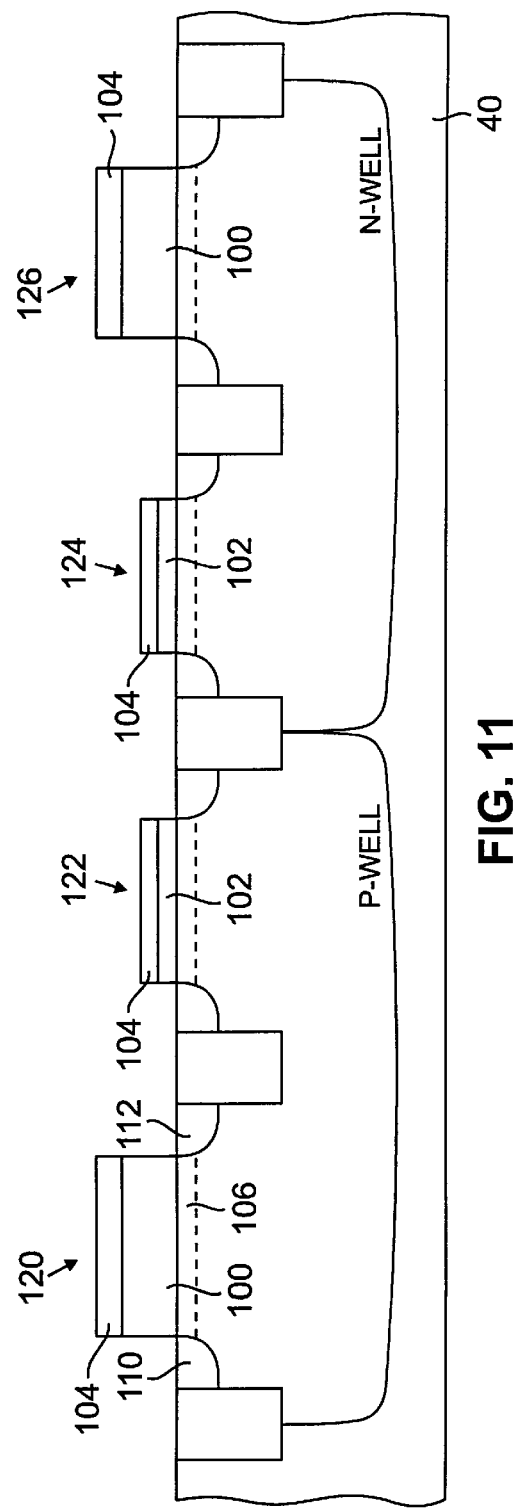
FIG. 11 is a cross-sectional view of an integrated circuit including high and low voltage transistors in accordance with the present invention

Turning now to FIG. 11, gate dielectric layers 100, 102 are formed on an upper surface of the semiconductor substrate 40. The gate dielectric layers 100, 102 have different thicknesses corresponding to the high and low voltage transistors. Gate dielectric layers 100 correspond to the high voltage transistors, and consequently; have a thickness greater than the gate dielectric layers 102 corresponding to the low voltage transistors. The gate dielectric layers 100, 102 typically comprises a thermally formed oxide layer of approximately 2 to 20 nm. Growing gate oxide layers having different thicknesses is well known by one skilled in the art, and need not be explained in any further detail herein After the gate dielectric layers 100, 102 are formed, a conductive gate 104 is formed on the gate dielectric layers 100, 102. In one embodiment, the conductive gates 104 are heavily doped CVD polysilicon. Still referring to FIG. 11, the conductive gates 104 are formed such that they are aligned over a channel region 106 associated with each of the transistors to be formed. Source/drain regions 110, 112 of the individual transistors are then formed. The process for forming the source/drain regions 110, 112 for both the n-channel and the p-channel regions may be performed by a variety of methods, such as simple implantations, lightly doped drain (LDD) implantations, halo implantations, oxide or nitride spacers, and heavy implantations, as readily understood by one skilled in the art.

Still referring to FIG. 11, n-channel MOSFETs 120, 122 are formed in the n-channel region, and p-channel MOSFETs 124, 126 are formed in the p-channel region. The MOSFETs 122, 124 having the thin gate dielectric layers 102 are the low voltage transistors. These MOSFETs 122, 124 may operate at 1.0 volts to 2.5 volts. The MOSFETs 120, 126 having the thicker gate dielectric layers 100 are the high voltage transistors. These MOSFETs 120, 126 may operate at 2.5 volts to 5 volts.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making an integrated circuit including high and low voltage transistors comprising:

forming a plurality of spaced apart isolation regions in a substrate to define active regions therebetween;

forming a first mask;

using the first mask and performing at least one implant in the active regions for defining high voltage active regions for the high voltage transistors;

removing the first mask and forming a second mask;

using the second mask and performing only one implant for converting at least one high voltage active region into a low voltage active region for a low voltage transistor;

forming gate dielectric layers on the high and low voltage active regions for corresponding high and low voltage transistors, the gate dielectric layers being formed after the high and low voltage active regions have been defined; and forming gates on the gate dielectric layers.

2. A method according to claim 1, wherein using the first mask and performing at least one implant comprises implanting an impurity into the substrate defining a first well of a first conductivity type.

3. A method according to claim 1, wherein using the first mask and performing at least one implant comprises implanting an impurity to suppress punch-through of the high and low voltage transistors.

4. A method according to claim 1, wherein using the first mask and performing at least one implant comprises implanting an impurity to adjust a voltage threshold level of the high and low voltage transistors to a first voltage threshold level.

5. A method according to claim 1, wherein using the second mask and performing only one implant comprises implanting an impurity to adjust a first voltage threshold level of the low voltage transistor to a second voltage threshold level.

6. A method according to claim 1, wherein using the first mask and performing at least one implant comprises performing at least one implant using at least one of boron, phosphorous, arsenic and antimony.

7. A method according to claim 1, wherein using the second mask and performing only one implant comprises performing only one implant using at least one of boron, phosphorous, arsenic and antimony.

8. A method according to claim 1, wherein the high and low voltage transistors are n-channel metal oxide semiconductor field effect transistors (MOSFETS).

9. A method according to claim 1, wherein the high and low voltage transistors are p-channel metal oxide semiconductor field effect transistors (MOSFETS).

10. A method according to claim 1, wherein forming the gate dielectric layers comprises forming first gate dielectric layers having a first thickness for the high voltage transistors and second gate dielectric layers for the low voltage transistors having a second thickness less than the first thickness.

11. A method for making a CMOS integrated circuit including high and low voltage transistors of a first conductivity type and high and low voltage transistors of a second conductivity type, the method comprising:

forming a plurality of spaced apart isolation regions in a substrate to define active regions of a first conductivity type and active regions of a second conductivity type therebetween;

forming a first mask;

using the first mask and performing at least one implant in the active regions of the first conductivity type for defining high voltage active regions for the high voltage transistors of the first conductivity type;

removing the first mask and forming a second mask;

using the second mask and performing only one implant for converting at least one high voltage active region of the first conductivity type into a low voltage active region for a low voltage transistor of the first conductivity type;

removing the second mask and forming a third mask;

using the third mask and performing at least one implant in the active regions of the second conductivity type for defining high voltage active regions for the high voltage transistors of the second conductivity type;

removing the third mask and forming a fourth mask;

using the fourth mask and performing only one implant for converting at least one high voltage active region of the second conductivity type into a low voltage active region for a low voltage transistor of the second conductivity type;

forming gate dielectric layers on the high and low voltage active regions for corresponding high and low voltage transistors of the first and second conductivity types, the gate dielectric layers being formed after the high and low voltage active regions have been defined; and forming gates on the gate dielectric layers.

12. A method according to claim 11, wherein using the first mask and performing at least one implant comprises implanting an impurity into the substrate defining a first well of a first conductivity type.

13. A method according to claim 11, wherein using the first mask and performing at least one implant comprises implanting an impurity to suppress punch-through of the high and low voltage transistors of the first conductivity type.

14. A method according to claim 11, wherein using the first mask and performing at least one implant comprises implanting an impurity to adjust a voltage threshold level of the high and low voltage transistors of the first conductivity type to a first voltage threshold level.

15. A method according to claim 11, wherein using the second mask and performing only one implant comprises implanting an impurity to adjust a first voltage threshold level of the low voltage transistor of the first conductivity type to a second voltage threshold level.

16. A method according to claim 11, wherein using the first mask and performing at least one implant comprises performing at least one implant using boron.

17. A method according to claim 11, wherein using the second mask and performing only one implant comprises performing only one implant using boron.

18. A method according to claim 11, wherein using the third mask and performing at least one implant comprises implanting an impurity into the substrate defining a well of a second conductivity type.

19. A method according to claim 11, wherein using the third mask and performing at least one implant comprises implanting an impurity to suppress punch-through of the high and low voltage transistors of the second conductivity type.

20. A method according to claim 11, wherein using the third mask and performing at least one implant comprises implanting an impurity to adjust a voltage threshold level of the high and low voltage transistors of the second conductivity type to a first voltage threshold level.

21. A method according to claim 11, wherein using the fourth mask and performing only one implant comprises implanting an impurity to adjust a first voltage threshold level of the low voltage transistor of the second conductivity type to a second voltage threshold level.

22. A method according to claim 11, wherein using the third mask and performing at least one implant comprises performing at least one implant using at least one of phosphorous, arsenic and antimony.

23. A method according to claim 11, wherein using the fourth mask and performing only one implant comprises performing only one implant using at least one of phosphorous, arsenic and antimony.

24. A method according to claim 11, wherein the step of forming the gate dielectric layers comprises forming first gate dielectric layers having a first thickness for the high voltage transistors of the first and second conductivity types, and forming second gate dielectric layers for the low voltage transistors of the first and second conductivity types having a second thickness less than the first thickness.

25. A method for making an integrated circuit including first and second transistors respectively operating at first and second voltages, the method comprising:

forming a plurality of spaced apart isolation regions in a substrate to define active regions therebetween;

forming a first mask;

using the first mask and performing at least one implant in the active regions for defining first active regions for the first transistors;

removing the first mask and forming a second mask;

using the second mask and performing only one implant for converting at least one first active region into a second active region for a second transistor; and forming gate dielectric layers on the first and second active regions for corresponding first and second transistors, the gate dielectric layers being formed after the first and second active regions have been defined.

26. A method according to claim 25, wherein using the first mask and performing at least one implant comprises implanting an impurity into the substrate defining a first well of a first conductivity type.

27. A method according to claim 25, wherein using the first mask and performing at least one implant comprises implanting an impurity to suppress punch-through of the first and second transistors.

28. A method according to claim 25, wherein using the first mask and performing at least one implant comprises implanting an impurity to adjust a voltage threshold level of the first and second transistors to a first voltage threshold level.

29. A method according to claim 25, wherein using the second mask and performing only one implant comprises implanting an impurity to adjust a first voltage threshold level of the second transistor to a second voltage threshold level.

30. A method according to claim 25, wherein using the first mask and performing at least one implant comprises performing at least one implant using at least one of boron, phosphorous, arsenic and antimony.

31. A method according to claim 25, wherein using the second mask and performing only one implant comprises performing only one implant using at least one of boron, phosphorous, arsenic and antimony.

* * * * *

UNITED STATES PATENT AND TRADEMARK OFFICE
CERTIFICATE OF CORRECTION

PATENT NO. : 6,207,510 B1
DATED : March 27, 2001
INVENTOR(S) : Glenn C. Abeln, Robert Alan Ashton, Samir Chaudhry, Alan R. Massengale, Jinghui Ning Page 1 of 1

It is certified that error appears in the above-identified patent and that said Letters Patent is hereby corrected as shown below:

Column 1,
Line 28, delete "preform" insert -- perform --

Column 2,
Line 64, delete "preset" insert -- present --

Column 3,
Line 43, delete "be also be described in greater below." insert -- also be described in greater detail below. --

Column 4,
Line 54, delete "at a energy sufficient" insert -- at an energy sufficient --

Column 5,
Line 45, delete "62 The third" insert -- 62. The third --

Column 6,
Line 45, delete "at a energy sufficient" insert -- at an energy sufficient --

Column 8,
Line 2, delete "second third" insert -- second, third --
Line 14, delete "consequently; have" insert -- consequently, have --

Column 10,
Line 64, delete "the step of"

Signed and Sealed this

Twenty-seventh Day of November, 2001

Attest:

*Attesting Officer*

NICHOLAS P. GODICI
*Acting Director of the United States Patent and Trademark Office*